(12) United States Patent
Lenez et al.

(10) Patent No.: US 6,778,106 B2
(45) Date of Patent: Aug. 17, 2004

(54) DIGITAL SAMPLE SEQUENCE CONVERSION DEVICE

(75) Inventors: Thierry Lenez, Grenoble (FR); Eric Petit, Saint Martin d'Héres (FR)

(73) Assignee: STMicroelectronics S.A., Montrouge (FR)

( * ) Notice: Subject to any disclaimer, the term of this patent is extended or adjusted under 35 U.S.C. 154(b) by 0 days.

(21) Appl. No.: 10/184,017

(22) Filed: Jun. 26, 2002

(65) Prior Publication Data

US 2003/0065463 A1 Apr. 3, 2003

(30) Foreign Application Priority Data

Jun. 29, 2001 (FR) .............................................. 01 08693

(51) Int. Cl.[7] .................................................. H03M 7/00
(52) U.S. Cl. ........................................ 341/61; 341/143
(58) Field of Search .................................... 341/61, 143

(56) References Cited

U.S. PATENT DOCUMENTS

| | | | | |
|---|---|---|---|---|
| 4,536,745 A | * | 8/1985 | Yamaguchi et al. | .......... 341/61 |
| 5,621,404 A | * | 4/1997 | Heiss et al. | .................... 341/61 |
| 6,000,834 A | * | 12/1999 | Duan | ........................ 708/313 |
| 6,084,916 A | * | 7/2000 | Ott | .............................. 375/259 |
| 6,462,682 B2 | * | 10/2002 | Hellberg | ....................... 341/61 |
| 6,487,573 B1 | * | 11/2002 | Jiang et al. | ................. 708/313 |

FOREIGN PATENT DOCUMENTS

| | | | | |
|---|---|---|---|---|
| EP | 0695032 A1 | 1/1996 | .......... H03N/17/06 |

OTHER PUBLICATIONS

Adams, R., "Asynchronous Conversion Thwarts Incompatibility in Sampling A/D Systems", *EDN—Electrical Design News, 39*: pp 83–88, Jul. 21, 1994.

\* cited by examiner

*Primary Examiner*—Peguy JeanPierre
(74) *Attorney, Agent, or Firm*—Lisa K. Jorgenson; Dennis M. de Guzman; Seed IP Law Group PLLC

(57) ABSTRACT

A device for automatically converting a digital sample sequence X(n) inputted at a first frequency $f_e$ and converted into an output digital sample sequence Y(m) at a second frequency $f_s$ which is smaller than $f_e$. An interpolator-decimator assembly having a decimation rate equal to γ, selected so as to correspond to the frequency offset $f_e/f_s$ is based on a polyphased filter having p tables of q elements each, said filter being designed such that samples X(n) are input at the $f_e$ frequency and table components are activated according to clocking of a second clock derived from the $f_e$ clock and wherein one clock pulse is removed.

21 Claims, 7 Drawing Sheets

Interpolator     Common filter     Decimator

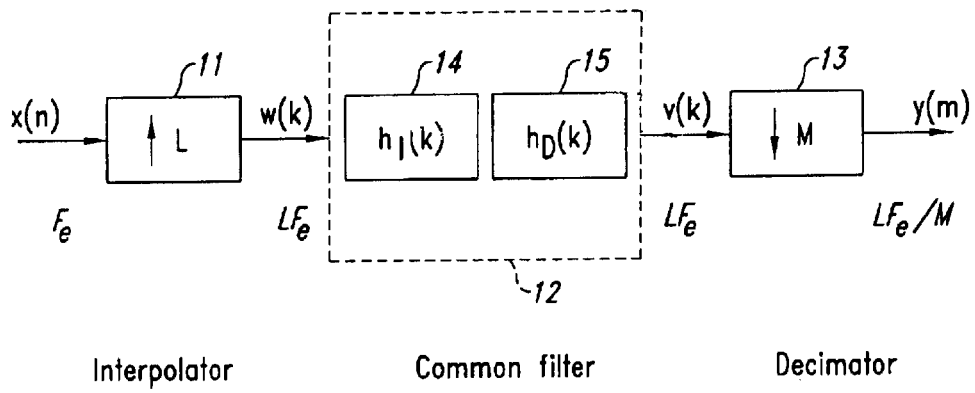
Fig. 1
$$y(mT_s) = \sum_{n=-N}^{N} h(nT_e + (\gamma m \oplus 1)T_e) x([\gamma m]T_e - nT_e)$$
Fig. 2
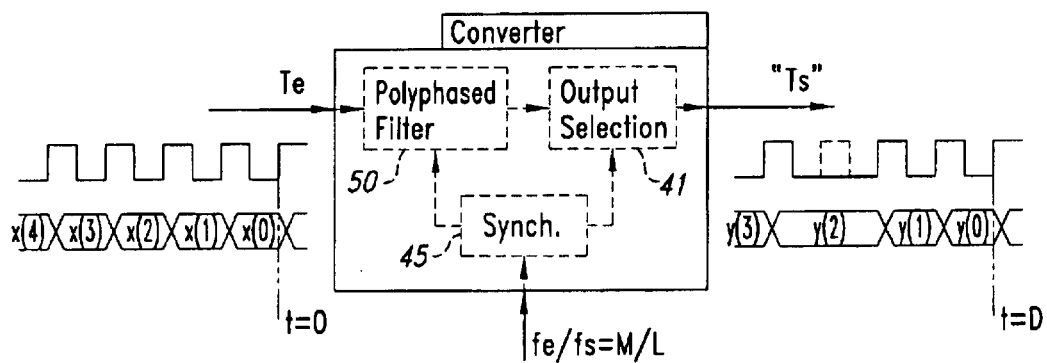
Fig. 3 the drawings.

DIGITAL SAMPLE SEQUENCE CONVERSION DEVICE

BACKGROUND OF THE INVENTION

1. Field of the Invention

The present invention relates to the field of digital communications and more particularly to a method for converting digital samples.

2. Description of the Related Art

The field of digital communications is constantly developing and communication rates increase continuously.

Considering a digital communication system's architecture, it must be reminded that, typically, a digital signal—generally a series of symbols to be transmitted—is converted into a continuous time analog signal which is in turn transmitted by a physical propagation medium, air or any other physical medium of propagation. Upon reception by a receiver, the signal is then processed and converted into a digital form by means of an adequate sample, which generally operates at a frequency $f_e$ which is generally made synchronous with the frequency $f_s$ to the symbol's transmission. Unfortunately, oscillator circuits provided within the emitter and the receiver are never synchronous and any frequency offset between the emission and reception clocks must then be compensated in order to allow for correct processing of the received signal and reading of emitted symbols. Frequency compensation at reception is typically carried out with a voltage-controlled oscillator circuit, which is controlled by a clocking circuit which estimates the amount of frequency offset that must be compensated for.

Unfortunately, voltage controlled circuits and controlled sampling circuits are inaccurate, complex analog devices, which are costly to implement and allow little flexibility in signal processing. Currently overall digital processing of information is widely preferred in transmission systems comprising as few analog only circuits as possible.

It is therefore desirable to avoid using voltage-controlled circuits, or even a controlled sampler. It is desirable to be allowed to realize free sampling of an analog signal and then to convert digital samples at another frequency.

BRIEF SUMMARY OF THE INVENTION

An embodiment of the present invention is aimed at providing a device for digitally converting the sampling rate of a sequence of digital samples X(n) inputted at a frequency $f_e$ and converted into an output sequence Y(m) outputted with a frequency $f_s$.

Another embodiment of the present invention provides an analog signal sampling device which requires no voltage-controlled oscillator to realize the controlled sampling.

An embodiment of the invention includes a device which automatically converts an input digital sample sequence X(n) at a first frequency $f_e$ into an output digital sample sequence Y(m) with a second frequency $f_s$ smaller than $f_e$. An interpolator-decimator assembly with a decimation rate equal to γ chosen to correspond to the frequency offset $f_e/f_s$ is based on a polyphased filter having p tables of q elements each, said filter being adapted to receive samples X(n) delivered at a frequency $f_e$ and said filter polyphased components are successively activated according to clocking of a second clock derived from the $f_i$, clock and which lacks clock pulses.

Preferably, this device comprises a clocking unit to successively activate polyphased components at the output frequency $f_s$ clocking and a filter output sequence Y(m) selection circuit to keep only the correct sequence of samples corresponding to an interpolation-decimation to a non-integer factor.

In an embodiment, a counter is used to generate a signal each time operand γm⊕1 reaches an integer value, which is used to control said data Y(m) selection circuit.

In a preferred embodiment, the device is provided with an interpolator decimator based on a polyphased filter, which comprises a series of p=2N+1 tables each having a set of q factors used to calculate a convolution between an interpolation/decimation filter and a vector X(n) corresponding to the input digital sample sequence.

DESCRIPTION OF THE SEVERAL VIEWS OF THE DRAWINGS

Non-limiting and non-exhaustive embodiments of the invention are illustrated by way of example in the following figures, wherein like reference numerals refer to like parts throughout the various views unless otherwise specified.

FIG. 1 illustrates a flowchart of a cascade interpolator-decimator to realize non-integer factor decimation.

FIG. 2 shows the formula for non-integer factor interpolation-decimation of the sample X(n) sequence.

FIG. 3 shows a flowchart of the sampling instant conversion circuit.

DETAILED DESCRIPTION OF THE INVENTION

Figure 4:
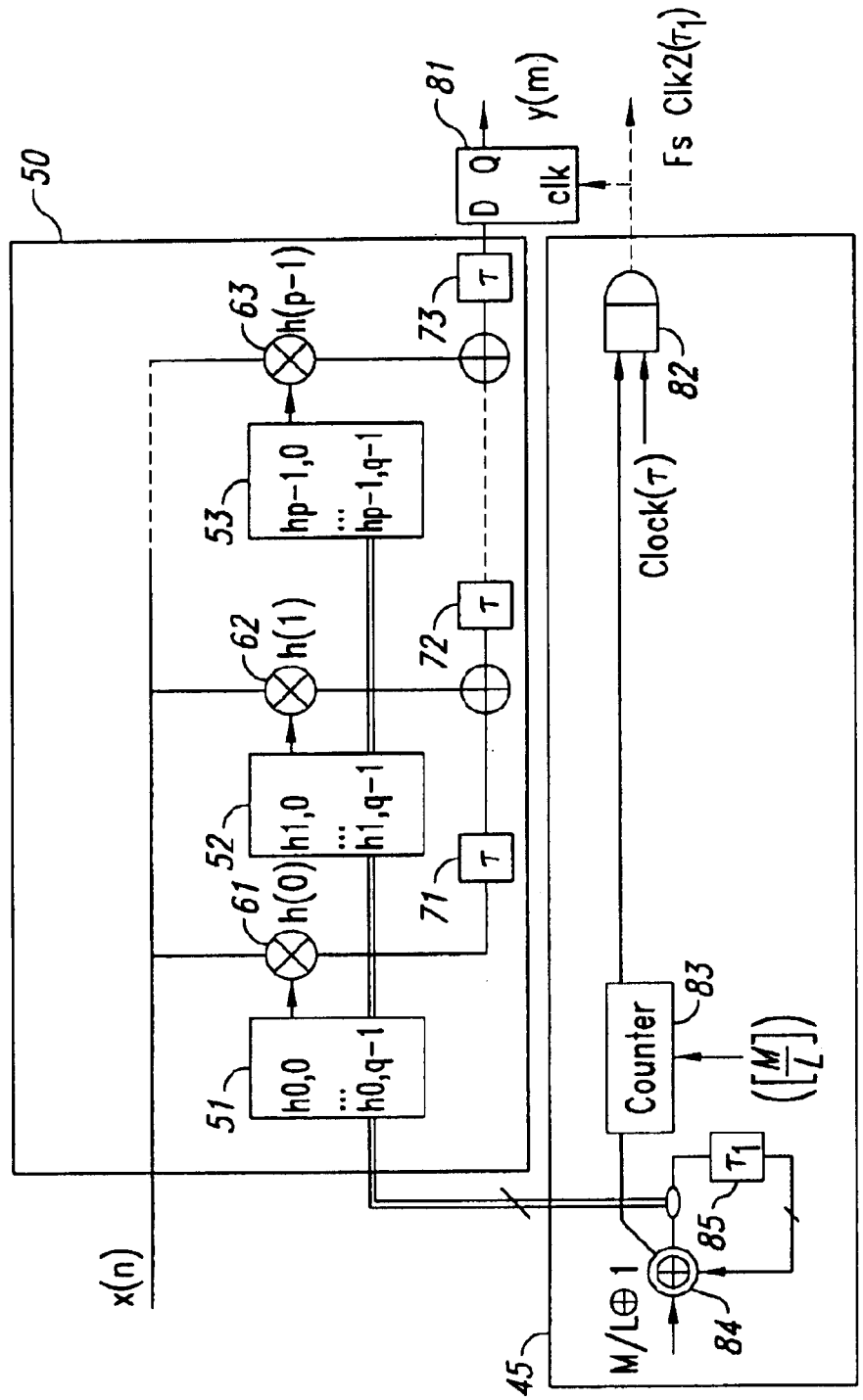
FIG. 4 shows a block-diagram of the polyphased filter and the $f_s$ clock generation circuit and polyphased filter table synchronization circuit.

Embodiments of a digital sample sequence conversion device are described herein. In the following description, numerous specific details are given to provide a thorough understanding of embodiments of the invention. One skilled in the relevant art will recognize, however, that the invention can be practiced without one or more of the specific details, or with other methods, components, materials, etc. In other instances, well-known structures, materials, or operations are not shown or described in detail to avoid obscuring aspects of the invention.

Reference throughout this specification to "one embodiment" or "an embodiment" means that a particular feature, structure, or characteristic described in connection with the embodiment is included in at least one embodiment of the present invention. Thus, the appearances of the phrases "in one embodiment" or "in an embodiment" in various places throughout this specification are not necessarily all referring to the same embodiment. Furthermore, the particular features, structures, or characteristics may be combined in any suitable manner in one or more embodiments.

FIG. 1 shows the flowchart of an interpolator-decimator assembly allowing to perform non-integer decimation. Samples X(n) are provided at a frequency $f_e$ which corresponds to that of a free sampler the nominal frequency of which, for example, has been set to a value slightly greater than the frequency used at sample emission. In another embodiment, the nominal frequency value can advantageously be set to twice the emission frequency value, which permits a large decimation range. In another embodiment, for example for applications in Very high bit rates Digital Subscriber Line (VDSL) type transmission networks, at emission an interpolator can already be introduced with corresponding oversampling. Such a sampler can be introduced to simplify the designing of analog circuits necessary to synchronously receive signals. So generally, people qualified in the art will have the possibility to choose frequency nominal values according to the desired concrete application for the receiver or for any other digital processing device requiring conversion of a sampling frequency. As will be seen further, it is not necessary that frequency nominal values match exactly, since adequate digital processing provides automatic correction to any frequency drift.

Referring to FIG. 1, processing of elements X(n) arriving at frequency $f_e$ is now described. First, oversampling to a factor L—represented by functional block 11—is realized in order to insert L−1 zeros between two successive samples X(n) and X(n+1). It results in a new sample sequence W(k) which, as is known in the art, has two image spectrums which are then suppressed by a first filtering operation $h_I(k)$ with a filter 14, followed by a second filtering operation $h_D(k)$, represented by block 15, in order to prepare the sequence for a later decimation operation.

The generated output sequence V(k) from block 15 is then subjected to a decimation by factor M (represented by element 13) in order to generate sample sequence Y(m) at a frequency equal to L/M times the input frequency $f_e$. As mentioned above, the L/M rate shall be chosen according to the particular desired application and an architecture to automatically produce a conversion effect as well as $f_s$ clock generation will now be described.

The interpolator-decimator as shown in FIG. 1, including both filters 14 and 15 noted by generic element 12, allows to realize an interpolation-decimation processing with a non-integer factor, according to the formula shown in FIG. 2 in which a convolution is realized on 2×N+1 elements of an input vector X(n) and a filter H corresponding to combination of elements 14 and 15 in FIG. 1. $T_e$ and $T_s$ correspond to reciprocals of the interpolator-decimator input frequency $f_e$ and output frequency $f_s$ respectively. Generally, the setting of 2×N+1 will be related to the available computational power and to the level of precision desired for symbol clock conversion operation. It is to be noted that if particularly fine adjustments of the decimation factor M/L are desired, the convolution computing must be adjusted accordingly.

If the decimation factor γ is noted M/L, then the formula can be condensed as followed:

$$y(m) = \Sigma h(n + \gamma m \oplus 1) \times (\lfloor \gamma m \rfloor - n) \quad (1)$$

where, conventionally, operators $\oplus 1$ and $\lfloor \, \rfloor$ refer to the fractional part and the lower integral part of the operand.

When considering, for instance, M=6 and L=5, the interpolation-decimation rate is equal to γ=M/L=1.2.

By partially developing this formula about central point N=0 (represented in bold characters) the following development is obtained for m=0:

$Y(0) = \ldots + h(-2) \times (2) + h(-1) \times (1) + h(0) \times (0) + h(1) \times (-1) + h(2)(-2) + \ldots$ Since γm⊕1 and ⌊γm⌋ equals 0(m=0). If one now applies the formula to m=1—leading to values γm⊕1=0.2 and ⌊γm⌋=1 respectively, the following development is obtained for Y(1):

$Y(1) = \ldots + h(-2+0.2) \times (1+2) + h(-1+0.2) \times (1+1) + h(0+0.2) \times (1+0) + h(1+0.2) \times (1-1) + h(2+0.2) \times (1-2) + \ldots$ i.e., $Y(1) = \ldots + h(-2+0.2) \times (3) + h(-1+0.2) \times (2) + h(0+0.2) \times (1) + h(1+0.2) \times (0) + h(2+0.2) \times (-1) + \ldots$ For successive values m=2, m=3, m=4:

$Y(2) = \ldots + h(-2+0.4) \times (4) + h(-1+0.4) \times (3) + h(0+0.4) \times (2) + h(1+0.4) \times (1) + h(2+0.4) \times (0) + \ldots$ $Y(3) = \ldots + h(-2+0.6) \times (5) + h(-1+0.6) \times (4) + h(0+0.6) \times (3) + h(1+0.6) \times (2) + h(2+0.6) \times (1) + \ldots$ $Y(4) = \ldots + h(-2+0.8) \times (6) + h(-1+0.8) \times (5) + h(0+0.8) \times (4) + h(1+0.8) \times (3) + h(2+0.8) \times (2) + \ldots$ For m=5, it is noted that γm⊕1=0 and ⌊γm⌋=6, which leads to the following development for Y(5):

$Y(5) = \ldots + h(-2+0) \times (8) + h(-1+0) \times (7) + h(0+0) \times (6) + h(1+0) \times (5) + h(2+0) \times (4) + \ldots$ And for m=6, the result is:

$Y(6) = \ldots + h(-2+0.2) \times (9) + h(-1+0.2) \times (8) + h(0+0.2) \times (7) + h(1+0.2) \times (6) + h(2+0.2) \times (5) + \ldots$ It can be observed that an offset is established between calculations of Y(4) and Y(5) since, for the former, the convolution central cofactor corresponds to x(4) whereas for the latter the central cofactor corresponds to x(6).

More generally, the two following things can be noted. First, the filter response to be used by the decimator must be continuously changed in order to generate the conversion circuit output elements Y(m). Furthermore, although they are continuously changing, H filtration coefficients periodically reappear. Secondly, an offset between the X(n) sequence and the Y(m) sequence is also observed, said offset will correspond to the frequency conversion introduced between the interpolator-decimator input and output.

FIG. 3 illustrates the general flowchart of a converter to automatically convert a first sequence of samples X(n) at a first frequency $f_e$ into a second sequence of samples Y(m) at a second frequency $f_s$. To do so, a polyphased filter 50 for receiving the sample sequence X(n) at frequency $f_e$ as an input and having coefficient tables which are clocked by a synchronization system 45, for generating second output frequency $f_s$ of elements Y(m) is used. As the number of input elements is greater than the number of output elements, a selection circuit 41 is used to produce the right number of samples Y(m).

FIG. 4 shows a detailed view of the sampling converter. The polyphased filter 50, receiving samples X(n) as an input, comprises a series of p tables (p=2×N+1), each table comprising q elements. The number of elements in each table is selected according to the desired level of precision for frequency conversion. For a frequency conversion of 1/100, it must be noted that the polyphased filter would comprise tables comprising no fewer than 100 elements. FIG. 4 shows only a limited number of tables, i.e., a table 51 containing q elements h(0,0) to h(0, q−1) used in calculating a given cofactor in formula (1). A table 52 contains q additional elements corresponding to coefficients h(1, 0) to h(1, q−1).

Figure 5:
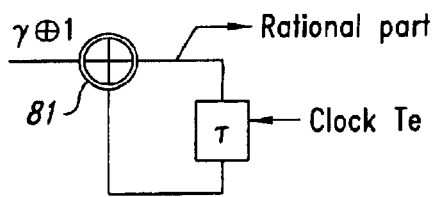
FIG. 5 shows a block-diagram of the selection circuit of the polyphased filter table element.

A table 53 contains q coefficients h(2, 0) to h(2, q−1). As can be seen in FIG. 4 and more particularly in FIG. 5, selection of components of the polyphased filter 50 tables is realized by means of a modulo1 adder which allows to successively activate the different components of the polyphased filter 50 tables at clock frequency $f_e$. A set of multipliers—such as for instance elements 61 and 63 represented in FIG. 4—as well as delay elements (corresponding to samples X(n) input frequency) such as elements 71–72 and 73 are further provided to complete the polyphased filter structure. A polyphased filter structure is well known by people qualified in the art and therefore it will not be further explained herein. Note only that the structure assembly allows to calculate primary cofactors required for a convolution between filter H and input samples X(n), at a given moment.

Figure 6:
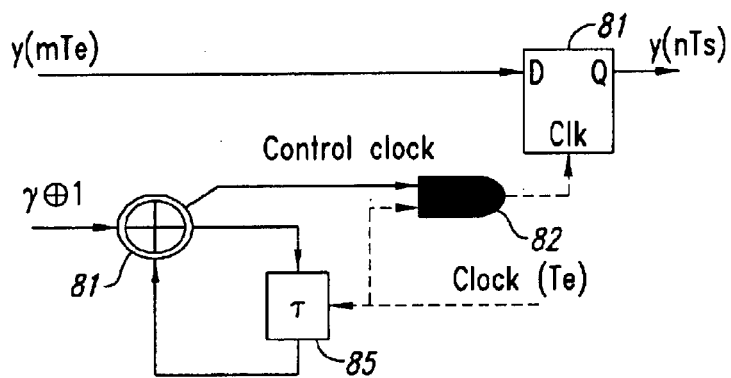
FIG. 6 shows a block-diagram of the $f_s$ clock generation circuit when the decimation rate is between 1 and 2.

Selection of the polyphased filter output data depends on the γ value considered. FIG. 6 shows an embodiment corresponding to a γ value between 1 and 2. In that case, circuit 81 output realizing a modulo1 add can be used directly to control an AND gate 82 the second input of which receives the input frequency $f_e$ (=1/$T_e$). The AND gate output is then connected to the clock input to a latch D81 receiving the polyphased filter output sequence Y(m) to its input Q. As can be seen more particularly in FIG. 8 timing diagrams, corresponding to the particular case when γ=6/5, frequency $f_s$ pulse sequence has a defect or "a gap" which allows to generate the frequency offset, and more importantly to produce a Y(m) sample sequence comprising the desired "offset" between Y(4) and Y(5).

Figure 7:
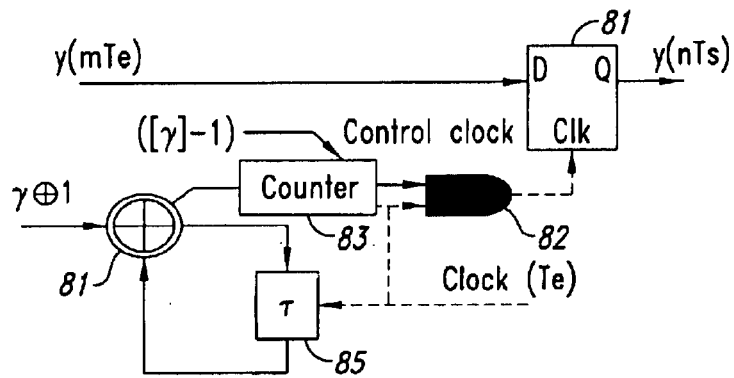
FIG. 7 shows how to modify the clock generation circuit in the general case when γ is greater than 2.

FIG. 7 shows a circuit adapted to the general case wherein γ>1. In that case a counting unit is introduced between modulo1 adder 81 output and AND gate 82 input, to effect the desired correction causing one pulse of frequency $f_e$ to be removed each time the ⌊γm⌋ operand becomes an integer value.

So, clock $f_s$ is thus created by removing one primary pulse every q $f_e$ clock pulses, that pulse matching the time of offset between output sample Y(m) level and input sample X(n) level. Applying this clock signal to latch D clock input causes the latch to keep on outputting the value provided through the preceding calculation and thus, on the next occurrence, provides the desired offset to obtain sample Y(m) sequence.

As can be seen, a sequence of samples Y(m) is thus obtained which, although they are synchronous to input samples X(n) at any moment, are output at a new adjustable frequency, as a function of the decimation rate γ, and their values correspond to true samples that would have been taken from a true analog signal if sampling had been realized at that second frequency.

Figure 8:
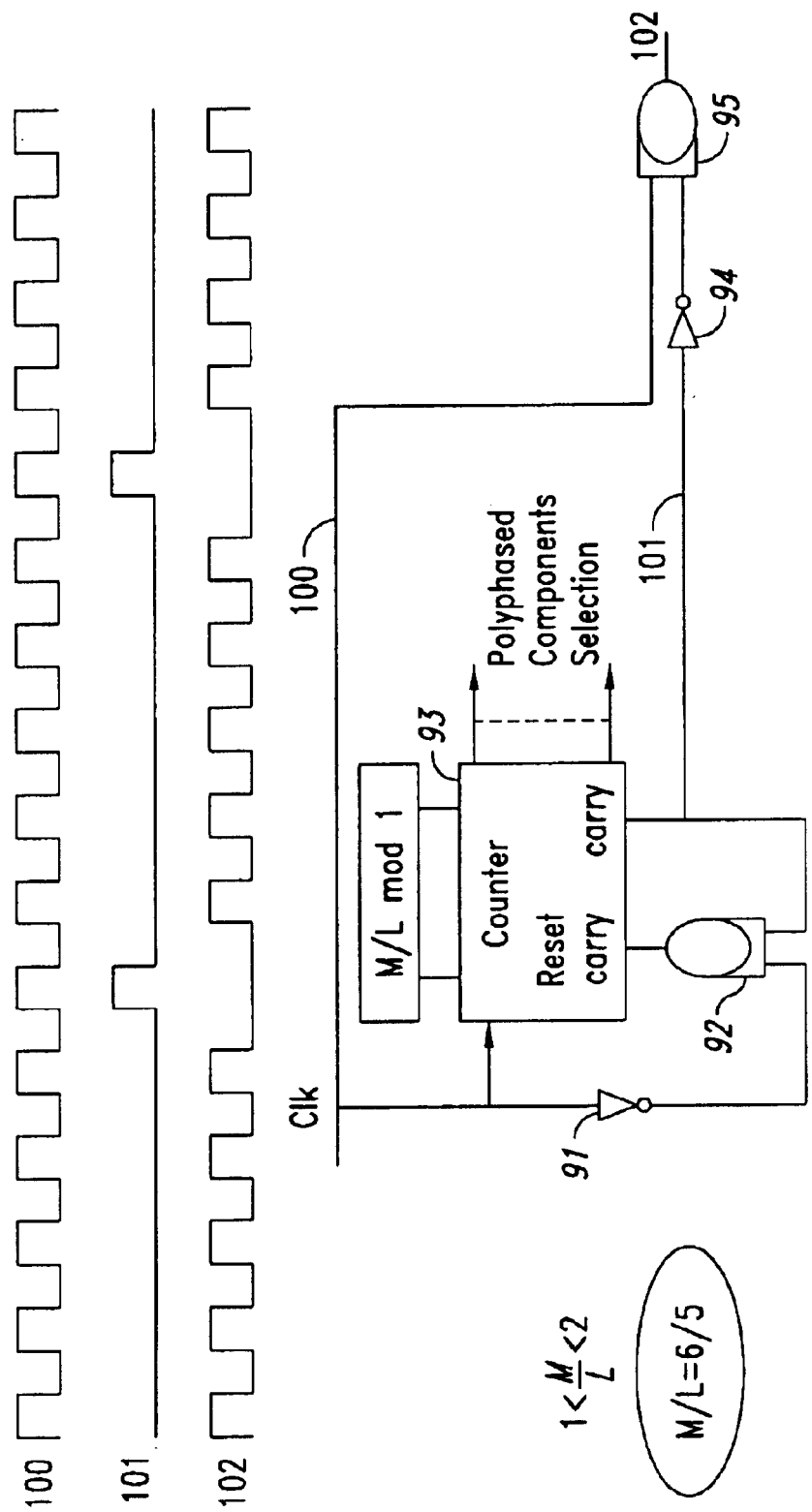
FIG. 8 shows a detailed embodiment for γ=6/5 together with timing diagrams representative of generated clock signals.

FIG. 8 illustrates more particularly an embodiment corresponding to γ=6/5. A circuit 100 transmits input frequency $f_e$ to a counter 93 clock input and to an input to inverter 91 the output of which is connected to a first input to an AND gate 92, a second input of which receives a CARRY signal from counter 93. The AND gate 92 output is used to reset counter 93 CARRY, thereby generating of the value of successive add of γm ⊕1's or M/L⊕1's. Counter 93 can thus be directly used to select filter 50 polyphased components. The CARRY signal is transmitted through a circuit 100 to an inverter 94 the output of which is connected to a first input to an AND gate 102 the second input of which receives clock signal $f_e$ and circuit 102. Outputs the desired $f_s$ frequency. FIG. 8 illustrates more particularly timing diagrams for input clock signal (100), output clock signal (102) and CARRY signal (101).

Figure 9:
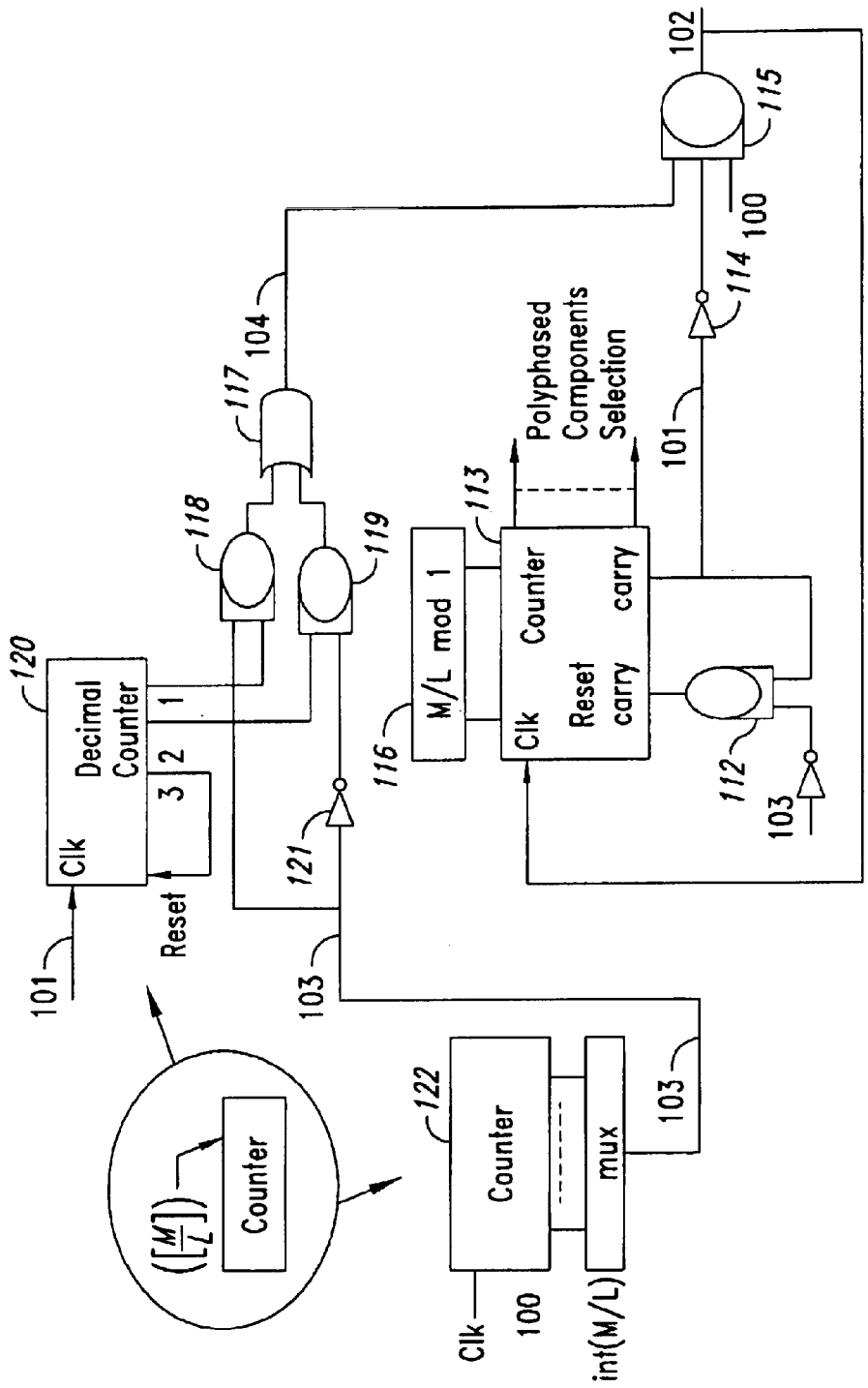
FIG. 9 shows a detailed embodiment of the $f_s$ clock generation circuit for γ=11/5.

FIG. 9 shows a modified structure corresponding to the case γ=2. A counter 113 allowing to select polyphased filter phases receives a clock signal from output 102 from an AND gate 115 having three inputs. A first input to AND gate 115 receives the output from an inverter 114 the input of which is connected to CARRY from counter 113. A second input to AND gate 115 receives the clock signal at frequency $f_e$ while a third input receives the output signal from an OR gate 117 via a circuit 104. Resetting of counter 113 CARRY is realized through an AND gate 112 which receives the CARRY signal to a first input and, the inverted output of a signal 103 generated by a counter 122 and corresponding to half the input frequency $f_e$ existing on circuit 100.

Figure 10:
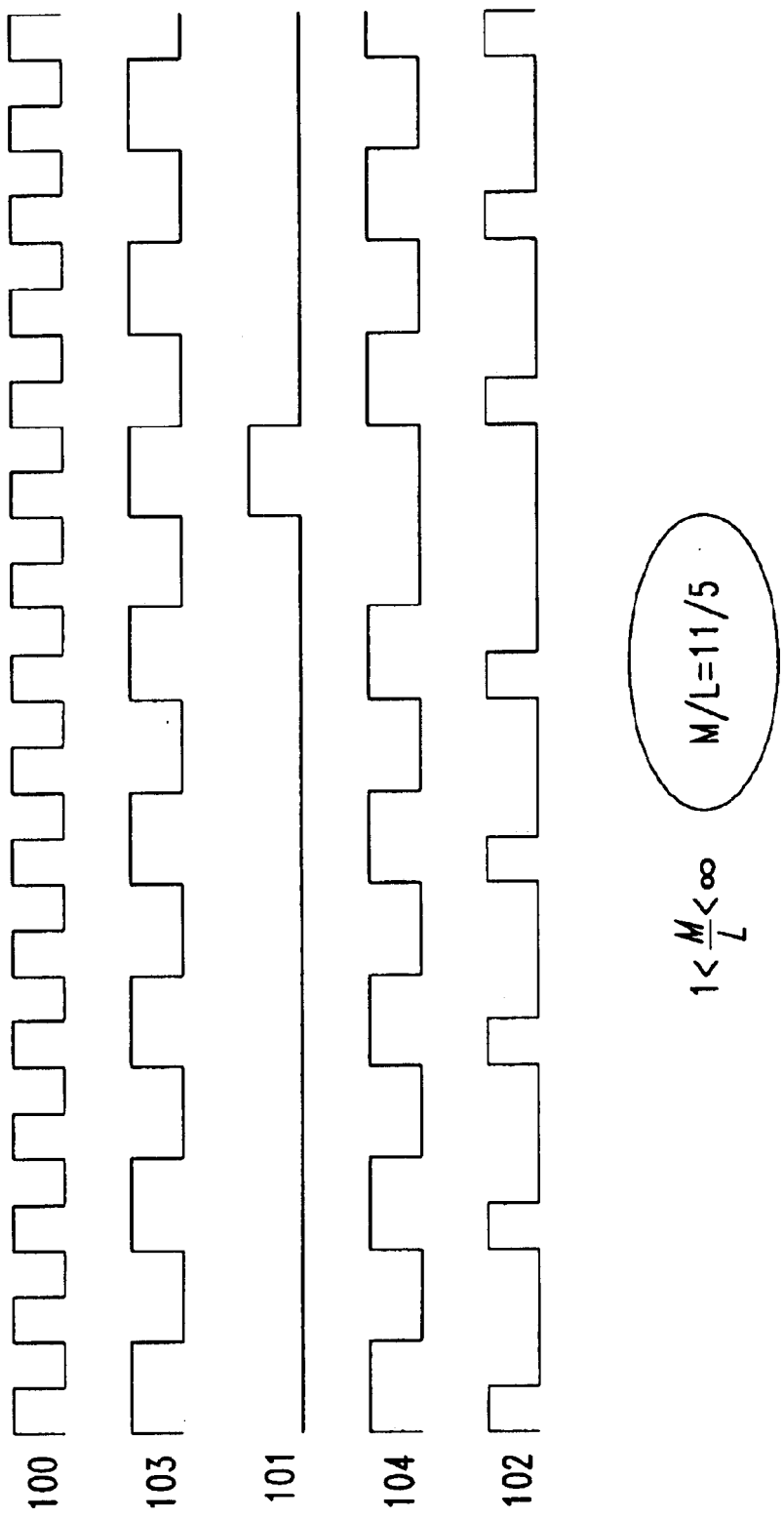
FIG. 10 illustrates representative timing diagrams for the case when γ=11/5.
Figure 11:
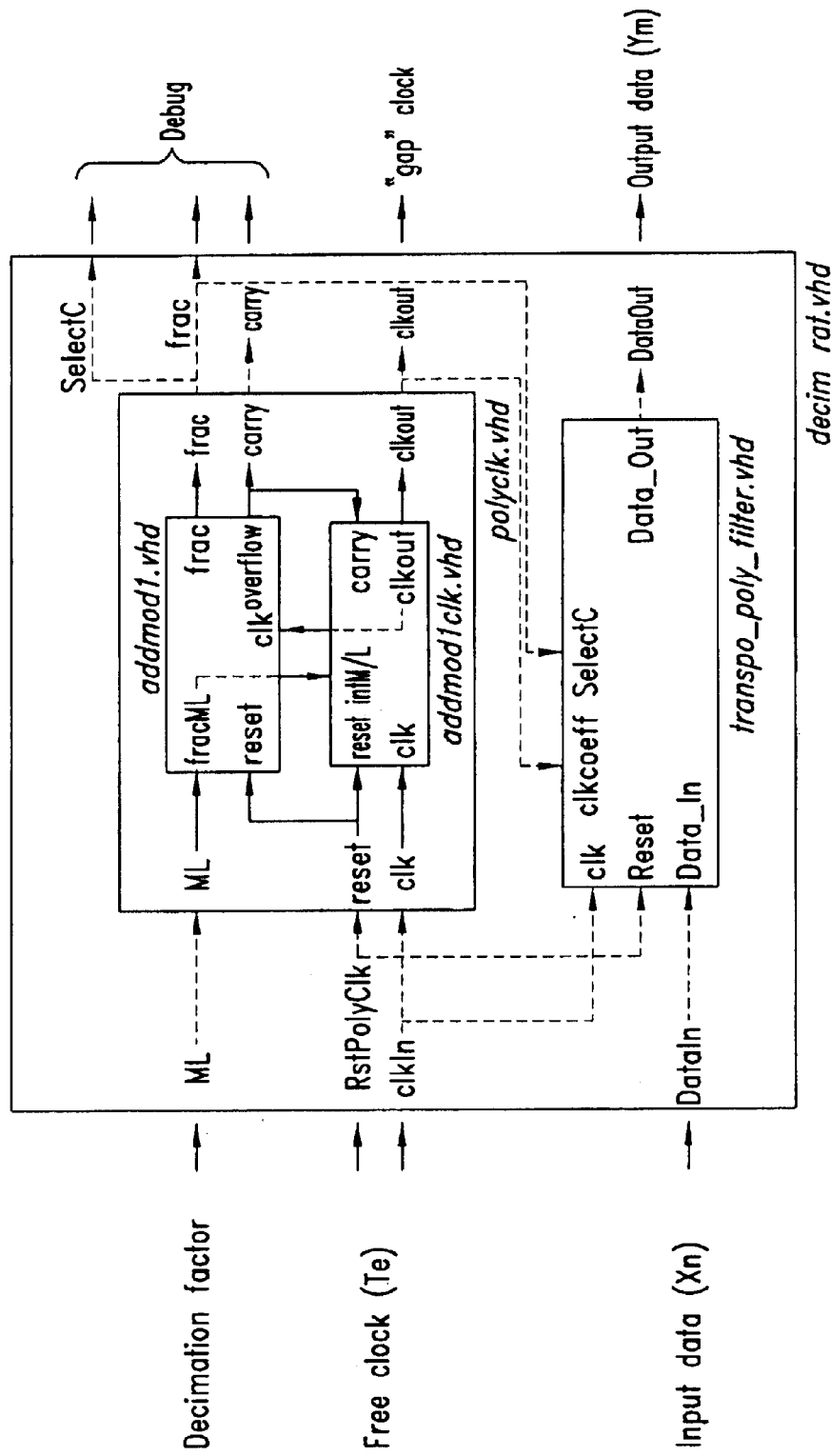
FIG. 11 shows an exemplary VHDL modeling.

AND gate 117 has two inputs which are connected to an AND gate 118 output and an AND gate 119 output, respectively. AND gate 118 has a first input connected to circuit 103 and a second input connected to a first output from a decimal counter 120—mounted as a frequency divider—and the clock input of which received the CARRY signal on circuit 101. AND gate 119 has a first input which is connected to circuit 103 via an inverter, and a second input connected to a second output from decimal counter 120. The decimal counter 120 third input is connected to the reset signal, thus insuring the desired frequency dividing. Timing diagrams representative of signals 100–104 are illustrated in FIG. 10 and FIG. 11 illustrates more particularly an embodiment which is directly translated into VHDL language.

The above description of illustrated embodiments of the invention, including what is described in the Abstract, is not intended to be exhaustive or to limit the invention to the precise forms disclosed. While specific embodiments of, and examples for, the invention are described herein for illustrative purposes, various equivalent modifications are possible within the scope of the invention and can be made without deviating from the spirit and scope of the invention.

These and other modifications can be made to the invention in light of the above detailed description. The terms used in the following claims should not be construed to limit the invention to the specific embodiments disclosed in the specification and the claims. Rather, the scope of the invention is to be determined entirely by the following claims, which are to be construed in accordance with established doctrines of claim interpretation.

All of the above U.S. patents, U.S. patent application publications, U.S. patent applications, foreign patents, foreign patent applications and non-patent publications referred to in this specification and/or listed in the Application Data Sheet, are incorporated herein by reference, in their entirety.

What is claimed is:

1. A sampling frequency conversion device comprising:
   a free sampler realizing a first analog signal sampling at a first frequency ($f_e$) for generating digital samples X(n); and
   an interpolator-decimator having a decimation rate equal to γ based on a polyphased filter having p tables, each table comprising q elements, said polyphased filter being designed such that samples X(n) are inputted at a frequency of said first frequency $f_e$ and polyphased components being successively activated at a frequency of a second frequency $f_s$, derived from said first frequency $f_e$ by removing one pulse each time an ⌊γm⌋ operand becomes an integer value, so as to output a sample sequence corresponding to said second frequency.

2. A device according to claim 1, further comprising a synchronization unit for synchronizing said polyphased components and a filter output Y(m) selection circuit in order to produce an adequate sequence of samples Y(m) clocked to a correct $f_s$ frequency.

3. A device according to claim 2, further comprising a counter for generating a signal each time the $\lfloor \gamma m \rfloor$ operand becomes an integer value and for stopping transmission of an input clock clocked at said first frequency $f_e$ so as to generate an output clock at $f_s$ frequency which controls said selection circuit.

4. A device according to claim 1 wherein said polyphased filter comprises a series of p=2N+1 tables each having a set of q coefficients used to calculate a convolution between an interpolation-decimation filter and a vector corresponding to the input digital samples X(n), selection of said filter polyphased components being controlled by a modulo 1 adder operating at the frequency $f_s$.

5. A device according to claim 1, further comprising:
a counter having a clock input to receive the first frequency $f_e$;
a first AND gate having a first input to receive an inverted signal corresponding to the frequency $f_e$ and a second input to receive a carry signal from the counter, the first AND gate having an output coupled to a reset input of the counter to generate modulo 1 add values to select polyphased components; and
a second AND gate having a first input to receive the frequency $f_e$ and a second input to receive an inverted carry signal from the counter, the second AND gate having an output to generate. the second frequency $f_s$ based on the first frequency $f_e$ and the inverted carry signal at its inputs.

6. A device according to claim 1, further comprising:
a counter to select polyphased components, the counter including an input to receive a clock signal;
a first AND gate having a first input to receive an inverted carry signal from the counter, a second input to receive the first frequency $f_e$, and a third input to receive an output signal from a frequency divider circuit that divides the first frequency $f_e$, the first AND gate having an output coupled to the input of the counter to provide the clock signal to the counter based on the inputs to the first AND gate; and
a second AND gate having an output coupled to a reset input of the counter, the second AND gate having a first input to receive the carry signal from the counter and a second input to receive a signal corresponding to the divided first frequency $f_e$.

7. An apparatus, comprising:
a converter to convert first digital samples at a first frequency to second digital samples at a second frequency, the converter including:
a polyphased filter having a plurality of tables to process the first digital samples;
a synchronization unit coupled to the polyphased filter to clock the tables of the polyphased filter to generate the second frequency, derived from the first frequency via removal of a pulse from the first frequency each time an operand value associated with a decimation rate becomes an integer value; and
a selection circuit coupled to the polyphased filter and to the synchronization unit to generate the second digital samples from the first digital samples processed by the polyphased filter according to the second frequency.

8. The apparatus of claim 7 wherein the polyphased filter is capable to process the first digital samples via a series of p tables having q coefficients usable to calculate a convolution between an interpolation-decimation filter of the polyphased filter and a vector corresponding to the first digital samples.

9. The apparatus of claim 7, further comprising a counter coupled to the selection circuit to generate a signal to control the selection circuit to select samples to obtain the second digital samples each time an operand value associated with a frequency offset between the first and second frequencies becomes an integer value.

10. The apparatus of claim 7, further comprising a free sampler coupled to the converter to generate the first digital samples from a sampling of an input analog signal.

11. The apparatus of claim 7, further comprising:
a counter having a clock input to receive the first frequency;
a first AND gate having a first input to receive an inverted signal corresponding to the first frequency and a second input to receive a carry signal from the counter, the first AND gate having an output coupled to a reset input of the counter to generate module 1 add values to select tables of the polyphased filter to process the first digital samples; and
a second AND gate having a first input to receive the first frequency and a second input to receive an inverted carry signal from the counter, the second AND gate having an output to generate the second frequency based on the first frequency and the inverted carry signal at its inputs.

12. The apparatus of claim 7, further comprising:
a counter having an input to receive a clock signal;
a first AND gate having a first input to receive an inverted carry signal from the counter, a second input to receive the first frequency, and a third input to receive an output signal from a frequency divider circuit that divides the first frequency, the first AND gate having an output coupled to the input of the counter to provide a clock signal to the counter based on the inputs to the first AND gate to allow the counter to select tables of the polyphased filter; and
a second AND gate having an output coupled to a reset input of the counter, the second AND gate having a first input to receive the carry signal from the counter and a second input to receive a signal corresponding to the divided first frequency.

13. A method, comprising:
receiving first digital samples at a first frequency at a polyphased filter having a plurality of tables;
removing one pulse from the first frequency to obtain a second frequency, each time an operand associated with an offset between the first and second frequencies becomes an integer value; and
using the second frequency to selectively activate tables of the polyphased filter to generate an output of second digital samples at the second frequency.

14. The method of claim 13 wherein the tables of the polyphased filter include a set of coefficients, the method further comprising using the coefficients to calculate a convolution between an interpolation-decimation filter and a vector corresponding to the first digital samples to obtain values of the second digital samples.

15. The method of claim 13, further comprising:
generating a signal each time the operand becomes the integer value;
responsively stopping an input clock at the first frequency to generate an output clock at the second frequency; and
using the output clock at the second frequency to control selection of samples derived the first digital samples to obtain the second digital samples therefrom.

16. The method of claim 13, further comprising free sampling an analog signal at the first frequency to generate the first digital samples.

17. An article of manufacture, comprising:
   a machine-readable medium having stored thereon instructions to design an apparatus having:
      a polyphased filter having a plurality of tables to process first digital samples having a first frequency;
      a synchronization unit coupled to the polyphased filter to clock the tables of the polyphased filter to generate a second frequency, derived from the first frequency via removal of a pulse from the first frequency each time an operand value associated with a decimation rate becomes an integer value; and
      a selection circuit coupled to the polyphased filter and to the synchronization unit to generate the second digital samples from the first digital samples processed by the polyphased filter according to the second frequency.

18. The article of manufacture of claim 17 wherein the machine-readable medium further includes instructions stored thereon to design the apparatus wherein the polyphased filter is capable to process the first digital samples via a series of p tables having q coefficients usable to calculate a convolution between an interpolation-decimation filter of the polyphased filter and a vector corresponding to the first digital samples.

19. The article of manufacture of claim 17 wherein the machine-readable medium further includes instructions stored thereon to design the apparatus to include a counter coupled to the selection circuit to generate a signal to control the selection circuit to select samples to obtain the second digital samples each time an operand value associated with a frequency offset between the first and second frequencies becomes an integer value.

20. The article of manufacture of claim 17 wherein the machine-readable medium further includes instructions stored thereon to design the apparatus to include:
   a counter having a clock input to receive the first frequency;
   a first AND gate having a first input to receive an inverted signal corresponding to the first frequency and a second input to receive a carry signal from the counter, the first AND gate having an output coupled to a reset input of the counter to generate modulo 1 add values to select tables of the polyphased filter to process the first digital samples; and
   a second AND gate having a first input to receive the first frequency and a second input to receive an inverted carry signal from the counter, the second AND gate having an output to generate the second frequency based on the first frequency and the inverted carry signal at its inputs.

21. The article of manufacture of claim 17 wherein the machine-readable medium further includes instructions stored thereon to design the apparatus to include:
   a counter having an input to receive a clock signal;
   a first AND gate having a first input to receive an inverted carry signal from the counter, a second input to receive the first frequency, and a third input to receive an output signal from a frequency divider circuit that divides the first frequency, the first AND gate having an output coupled to the input of the counter to provide a clock signal to the counter based on the inputs to the first AND gate to allow the counter to select tables of the polyphased filter; and
   a second AND gate having an output coupled to a reset input of the counter, the second AND gate having a first input to receive the carry signal from the counter and a second input to receive a signal corresponding to the divided first frequency.

* * * * *

UNITED STATES PATENT AND TRADEMARK OFFICE
CERTIFICATE OF CORRECTION

PATENT NO. : 6,778,106 B2
DATED : August 17, 2004
INVENTOR(S) : Thierry Lenez et al.

It is certified that error appears in the above-identified patent and that said Letters Patent is hereby corrected as shown below:

Column 7,
Line 9, "q coefflcients" should read as -- q coefficients --.

Signed and Sealed this

First Day of February, 2005

JON W. DUDAS
*Director of the United States Patent and Trademark Office*